United States Patent
Ohama et al.

(10) Patent No.: US 7,074,731 B2
(45) Date of Patent: Jul. 11, 2006

(54) METHOD FOR PRODUCING HYDROGEN-DOPED SILICA POWDER, HYDROGEN-DOPED SILICA POWDER OBTAINED FROM THAT METHOD FOR USE IN A QUARTZ GLASS CRUCIBLE

(75) Inventors: Yasuo Ohama, Takefu (JP); Takayuki Togawa, Takefu (JP)

(73) Assignees: Heraeus Quarzglas GmbH & Co. KG, Hanau (DE); Shin-Etsu Quartz Products Co., Ltd., Tokyo (JP)

( * ) Notice: Subject to any disclaimer, the term of this patent is extended or adjusted under 35 U.S.C. 154(b) by 112 days.

(21) Appl. No.: 10/440,429

(22) Filed: May 16, 2003

(65) Prior Publication Data

US 2004/0025783 A1    Feb. 12, 2004

(30) Foreign Application Priority Data

May 17, 2002 (JP) ............................ 2002-143642

(51) Int. Cl.
*C03C 3/06* (2006.01)

(52) U.S. Cl. .................. 501/54; 501/133; 501/154; 117/200; 65/17.3

(58) Field of Classification Search .............. 501/54, 501/133, 154; 432/62, 64, 65; 65/17.3; 117/200

See application file for complete search history.

(56) References Cited

U.S. PATENT DOCUMENTS

| 6,849,242 B1 * | 2/2005 | Koeppler et al. ............ 423/338 |
| 2002/0122902 A1 * | 9/2002 | Ueda et al. ................. 428/34.4 |
| 2003/0066309 A1 | 4/2003 | Ueda et al. |
| 2003/0074920 A1 | 4/2003 | Ohama et al. |
| 2003/0131631 A1 * | 7/2003 | Ueda et al. ................... 65/111 |

FOREIGN PATENT DOCUMENTS

| EP | 1 020 546 A1 | 7/2000 |
| EP | 1 138 640 A2 | 4/2001 |
| JP | 05124889 A * | 5/1993 |

(Continued)

OTHER PUBLICATIONS

Journal of the Illuminating Engineering Institute of Japan, vol. 74, No. 9, pp. 27 to 32 (1990).

(Continued)

*Primary Examiner*—David Sample
(74) *Attorney, Agent, or Firm*—Tiajoloff & Kelly

(57) ABSTRACT

It is an object of the present invention to provide a hydrogen-doped silica powder that is useful in the formation of a quartz glass crucible that is capable of pulling a silicon single crystal without causing a state having dislocations in the silicon single crystal due to peeling of quartz glass segment. It is a further object of the invention to provide a quartz glass crucible for use in pulling a silicon single crystal whose inner surface is formed by use of the hydrogen-doped silica powder and a producing method of the silica powder.

In order to achieve the objects above, the present invention provides a hydrogen-doped silica powder for use in producing a quartz glass crucible for use in pulling a silicon single crystal, wherein the silica powder is made of synthetic silica powder, natural silica powder or a mixture thereof, with a hydrogen concentration being in the range of $1\times10^{17}$ to $5\times10^{19}$ molecules/cm$^3$, and a producing method thereof, and a quartz glass crucible for pulling a silicon single crystal whose inner surface is made of the silica powders.

8 Claims, 3 Drawing Sheets

FOREIGN PATENT DOCUMENTS

| | | | |
|---|---|---|---|
| JP | 08239231 A | * | 9/1996 |
| JP | 2000-044386 | | 2/2000 |
| JP | 2001261353 A | * | 9/2001 |
| JP | 2001-348240 | | 12/2001 |
| WO | WO 01/92169 A1 | | 12/2001 |

OTHER PUBLICATIONS

Patent Abstracts of Japan for Publication No. JP 2000-044386, Feb. 15, 2000.

Patent Abstracts of Japan for Publication No. JP 2001-348240, Dec. 18, 2001.

Patent Abstracts of Japan, vol. 2002, No. 04, Aug. 4, 2002, for JP 2001-348240 A (Dec. 18, 2001).

Patent Abstracts of Japan, vol. 1996, No. 06, Jun. 28, 1996, for JP 8-048532 A (Feb. 20, 1996).

Patent Abstracts of Japan, vol. 2000, No. 26, Jul. 1, 2002 for JP 2001-261353 A (Sep. 26, 2001).

* cited by examiner 1 mm 1 mm 1 mm 1 mm

METHOD FOR PRODUCING HYDROGEN-DOPED SILICA POWDER, HYDROGEN-DOPED SILICA POWDER OBTAINED FROM THAT METHOD FOR USE IN A QUARTZ GLASS CRUCIBLE

INDUSTRIAL FIELD OF APPLICATION

The present invention relates to silica powder for use in the production of quartz glass crucibles for pulling up silicon single crystals and to a production method thereof, as well as to a quartz glass crucible using the silica powder.; In further detail, the invention relates to silica powder capable of forming crucibles free from expansion of pores in pulling up single crystals under high temperature and reduced pressure, and to the production method of the silica powder.

PRIOR ART

As the production method for silicon single crystals, widely employed heretofore is the so-called Czochralski (CZ) method. The CZ method comprises melting polycrystalline silicon in a crucible made of quartz glass, immersing a seed crystal of silicon single crystal into the silicon melt, and gradually pulling up the seed crystal while rotating the crucible to grow the single crystal silicon from the seed crystal. The single crystal that is produced in said CZ method should be of high purity and capable of producing silicon wafers at high yield; as the quartz glass crucible for use in the production, employed is a double-structured quartz glass crucible comprising an inner layer free from pores and an opaque outer layer containing pores. This quartz glass crucible is generally produced by a so-called arc rotation melting process using high purity synthetic silica powder or synthetic cristobalite powder obtained by sol-gel process, or highly purified naturally occurring silica powder as the raw material; the powder is supplied to a rotating mold to form a powder layer along the inner plane of the mold, such that the powder layer is shaped into a quartz glass crucible-like form by heating and melting with arc from the inner side, and the arc is stopped to cool the mold to room temperature while continuing rotation thereof. The inner layer of the double structured quartz glass crucible is a transparent layer free from pores, however, in case silicon single crystal is pulled up under reduced pressure and at high temperature using the crucible, pores form and expand to cause peeling off of the inner surface of the crucible. Such peeled off quartz fractions adhere to the single crystal being pulled up, and transitions occur on the single crystal silicon as to disadvantageously make the production of high quality silicon single crystal unfeasible.

As a quartz glass crucible overcoming the disadvantages above, there has been proposed in Japanese Patent Laid-Open No. 2000-44386 a quartz glass crucible in which the heating conditions in melting the crucible base body and the silica powder in forming the transparent layer are selected to suppress the pore expansion occurring within a range of 1 mm or less thick from the inner surface after pulling up silicon single crystal. Further, in Japanese Patent Laid-Open No. 2001-348240 is proposed a quartz glass crucible produced by introducing water vapor inside the crucible base body in at least a part of the process for forming the inner layer of the quartz glass crucible. However, the former quartz glass crucible requires specified heating conditions and special silica powder, and could not be applied to all types of crucibles. Furthermore, in the latter case, there has been found a problem that the OH group concentration of the entire crucible increases as to easily lower the viscosity of quartz glass.

Problems the Invention is to Solve

In the light of the aforementioned circumstances, the present inventors have extensively conducted studies, and as a result, by using a silica powder doped with hydrogen molecules within a specified range as a raw material powder for forming at least the inner surface layer of the quartz glass crucible, it has been found that it can be applied to the production of all types of crucibles without specifying the silica powder and the heating conditions, that the pore expansion in the inner surface of the crucible can be suppressed without causing drop in the viscosity of quartz glass attributed to the increase in the OH group concentration, and that silicon single crystal can be pulled up at high yield without causing transition in silicon single crystal ascribed to the peeling off of quartz glass fractions. The present invention has been accomplished based on these findings. More specifically, An object of the present invention is to provide a hydrogen-doped silica powder for forming the inner surface layer of a quartz glass crucible capable of pulling up silicon single crystal at high yield without causing transition of silicon single crystal due to peeling off of quartz glass fractions.

Further, another object of the present invention is to provide a quartz glass crucible for pulling up silicon single crystal having an inner surface layer formed by using the silica powder above.

Furthermore, another object of the present invention is to provide a method for producing the silica powder above.

Means for Solving the Problems

In order to achieve the objects above, the present invention relates to a silica powder for forming at least the inner surface layer of the quartz glass crucible for pulling up silicon single crystal and to a method for producing the silica powder, as well as to a quartz glass crucible using the same.

More specifically, the present invention refers to hydrogen-doped silica powder for use in the production of a quartz glass crucible for use in pulling up silicon single crystal, wherein the silica powder is doped with hydrogen molecules in the range of $1 \times 10^{17}$ to $5 \times 10^{19}$ molecules/cm$^3$, and preferably, in the range of $5 \times 10^{17}$ to $3 \times 10^{19}$ molecules/cm$^3$.

Secondly, the invention refers to a method for producing hydrogen-doped silica powder, comprising performing heat treatment on high-purity silica powder under a hydrogen pressure in the range of 0.05 to 10 MPa and a temperature range of from 300 to 800° C.

The invention refers further to a quartz glass crucible for use in pulling up silicon single crystal, wherein a layer that extends at least up to 0.5 mm from an inner surface of the quartz glass crucible is a transparent quartz glass layer made of the hydrogen-doped silica powder with hydrogen molecules in the range of $1 \times 10^{17}$ to $5 \times 10^{19}$ molecules/cm$^3$, and preferably, in the range of $5 \times 10^{17}$ to $3 \times 10^{19}$ molecules/cm$^3$.

MODE FOR CARRYING OUT THE INVENTION

The mode for carrying out the invention is explained in further detail below, however, it should be understood that the present invention is not limited thereto.

A first aspect of the present invention is hydrogen-doped silica powder as described above, and as the silica powder, there can be mentioned crystalline or amorphous naturally occurring silica powder, or a crystalline or amorphous silica powder obtained synthetically by sol-gel process, hydrothermal synthetic method, oxyhydrogen flame synthetic method, and the like. The silica powders above may be used either alone or as a mixture thereof. The silica powder according to the present invention is hydrogen-doped silica powder doped with hydrogen molecules having hydrogen concentration in the range of $1\times10^{17}$ to $5\times10^{19}$ molecules/cm$^3$, and preferably, in the range of $5\times10^{17}$ to $3\times10^{19}$ molecules/cm$^3$. In case two types or more of silica powders are used as a mixture, the hydrogen concentration of the hydrogen-doped silica powder is set in a range of $5\times10^{17}$ to $8\times10^{19}$ molecules/cm$^3$, and the hydrogen-undoped silica powder is mixed therewith at a weight ratio in a range of from 2:1 to 1:500, such that the average hydrogen concentration falls in a range of $1\times10^{17}$ to $5\times10^{19}$ molecules/cm$^3$. Since crystalline silica powder is particularly inferior to amorphous silica powder in efficiency of hydrogen doping, it is preferably mixed with hydrogen-doped amorphous silica powder. By forming a transparent quartz glass layer that extends at least up to 0.5 mm from the inner surface of the quartz glass crucible using the hydrogen-doped silica powder above, no pore expansion occurs on the inner surface even in case silicon single crystal is pulled up at high temperature under reduced pressure. As a result, silicon single crystals can be produced at high yield without causing-transition of silicon single crystal attributed to the peeling off of quartz fractions occurring by pore expansion. According to the study of the present inventors, it has been found that the aforementioned pore expansion is attributed to free oxygen weakly bonded to glass structure, which is incorporated in the silica powder itself or taken up from the melt atmosphere on forming the inner surface layer. Thus, by setting the hydrogen concentration of the silica powder in the range above, the doped hydrogen molecules react with free oxygen to form OH groups, and the OH groups are fixed in the glass to suppress pore expansion from occurring. In this case, the concentration of the OH groups slightly increases, but not to such a value to influence the viscosity. In case hydrogen concentration is lower than $1\times10^{17}$ molecules/cm$^3$, the reaction of hydrogen molecules with free oxygen occurs only insufficiently and is not effective; in case hydrogen concentration exceeds $5\times10^{19}$ molecules/cm$^3$, hydrogen molecules react with oxygen even inside the glass structure, and increase the OH group concentration to form water, resulting in the generation of pore expansion. Further, in case the transparent quartz glass layer formed of the hydrogen-doped silica powder is thinner than 0.5 mm, it unfavorably results in small effect of suppressing the pore expansion.

The hydrogen concentration above is measured by a known evolved gas method, and a specific example thereof is shown in Journal of the Illuminating Engineering Institute of Japan, Volume 74, No. 9, pp. 27 to 32 (1990).

The hydrogen-doped silica powder according to the present invention is produced by thermally treating raw material silica powder in the temperature range of from 300 to 800° C. in an atmosphere under hydrogen gas pressure of 0.05 to 10 MPa. The hydrogen gas for use may be pure hydrogen gas or a gas mixture mixed with inert gas. As inert gas, any gas non-reactive with hydrogen and silica glass is usable, however, from economical viewpoint, there can be mentioned nitrogen gas, helium gas, and the like. In case aforementioned inert gas is incorporated, the hydrogen gas pressure signifies hydrogen gas partial pressure. Further, as the heating furnace for use in the heat treatment, preferred from the viewpoint of hydrogen doping is pressurizing treatment furnace (autoclave furnace). In case the heating temperature above is lower than 300° C., no sufficient doping of hydrogen molecules can be found, and the effect of suppressing pore expansion cannot be expected. In case the temperature exceeds 800° C., oxygen contained in the SiO$_2$ structure also is converted into OH groups, and this is not favorable. In case the hydrogen gas pressure is lower than 0.05 MPa, the amount of doped hydrogen becomes small, and the effect of suppressing pore expansion cannot be expected; in case the hydrogen gas pressure exceeds 10 MPa, hydrogen is excessively doped, and oxygen constituting the glass structure also is converted into OH groups in case the crucible is formed. This is not preferable because water causes pore expansion.

The hydrogen-doped silica powder obtained by the production method above is then used as the starting material for the quartz glass crucible for pulling up silicon single crystal, and known production methods can be employed as the production method for quartz glass crucible. In particular, preferred is the production method according to arc melting method as shown in FIG. 1. Referring to FIG. 1, in the arc melting method, silica powder is fed into a rotating mold 1, and after forming it into the shape of the crucible by applying centrifugal force, heat is applied by arc electrode 6 to form a translucent quartz glass crucible base body 5. Then, hydrogen-doped silica powder 4 is supplied from a powder supplying means 7 into the heated atmosphere during or after forming the crucible base body 5 to provide a transparent quartz glass layer 10 on the inner surface side of the crucible base body 5. In case a mixed powder is used as the hydrogen-doped silica powder 4, there may be used a mixed powder obtained by previously mixing the powder using a V-type mixer and the like, or hydrogen-doped silica powder and non-doped silica powder may be each supplied from each of the powder supply means in such a manner that the desired average hydrogen concentration can be attained in case the powder is supplied to the heated atmosphere.

EXAMPLES

Example 1 a) Production of Hydrogen-Doped Quartz Powder

High purity synthetic silica powder (with granularity in a range of 100 to 350 μm) obtained by sol-gel process was fed inside an autoclave furnace, and was subjected to heat treatment for 10 hours while setting the hydrogen gas pressure inside the furnace to 2 MPa and the temperature inside the furnace to 600° C. The hydrogen concentration of the silica powder thus obtained was found to be $8\times10^{18}$ molecules/cm$^3$.

b) Production of Quartz Glass Crucible

High purity naturally occurring silica powder subjected to purification treatment was fed inside a rotating mold 1 of the apparatus shown in FIG. 1, and was formed into the shape of quartz glass crucible by applying centrifugal force. An arc electrode 6 was inserted into the shaped powder, and after covering the aperture part 9 with a ring-like lid 8 and by setting a high temperature gas atmosphere inside the cavity 3 by using the arc electrode 6, the shaped powder was molten and vitrified. Thus, a translucent quartz glass crucible base body 5 was obtained by cooling the melt. Then, while rotating the mold 1, the inside of the translucent quartz glass crucible base body 5 was set to a high temperature atmosphere by using the arc electrode 6, and hydrogen-doped quartz powder 4 was supplied in small portions to form about 2 mm thick transparent quartz glass layer 10 on the inner surface of the translucent quartz glass crucible base body 5 by melting to form a monolithic body. The diameter of the thus obtained quartz glass crucible was 22 inch.

c) Pulling Up of Silicon Single Crystal

Polycrystalline silicon was fed inside the quartz glass crucible above to pull up silicon single crystal according to CZ method. Favorable silicon single crystal was pulled up after operation for about 90 hours. On visually observing the transparent quartz glass layer of the quartz glass crucible after usage, no pore expansion was observed in the vicinity of the inner plane. The curved (r) part of the quartz glass crucible was cut to a thickness of 3.0 mm, and the cross section morphology was observed under microscope to obtain FIG. 2.

Example 2

Hydrogen-doped silica powder was produced in the same manner as in Example 1, except for changing the hydrogen partial pressure to 0.1 MPa, the heating temperature to 400° C., and the treatment time duration to 40 hours. The hydrogen concentration of the silica powder thus obtained was found to be $6 \times 10^{17}$ molecules/cm$^3$.

A 22-inch diameter quartz glass crucible was produced in the same manner as in Example 1 by using the hydrogen-doped silica powder above, and a silicon single crystal was pulled up. After operation for 90 hours, the transparent quartz glass layer of the quartz glass crucible was subjected to visual observation, but no pore expansion was observed in the vicinity of the inner plane.

Example 3

A 22-inch diameter quartz glass crucible was produced and a silicon single crystal was pulled up in the same manner as in Example 1, except for using a mixed silica powder (having an average hydrogen concentration of $2 \times 10^{17}$ molecules/cm$^3$) consisting of about 1:400 weight ratio of synthetic silica powder (having an average hydrogen concentration of $8 \times 10^{19}$ molecules/cm$^3$, which was obtained by thermally treating silica powder having transparent quartz glass layer under hydrogen partial pressure of 10 MPa and at a temperature of 300° C. for a duration of 40 hours) and hydrogen-undoped naturally occurring silica powder. After operation for 90 hours, the transparent quartz glass layer of the quartz glass crucible was subjected to visual observation, but no pore expansion was observed in the vicinity of the inner plane.

Comparative Example 1

A 22-inch diameter quartz glass crucible was produced and a silicon single crystal was pulled up therefrom in the same manner as in Example 1, except for using hydrogen-undoped synthetic silica powder as the quartz glass powder. After operation for 60 hours, pulling up was stopped because disordering generated on the single crystal. After use, the transparent quartz glass layer of the quartz glass crucible was visually observed to find numerous pore expansions in the vicinity of the inner plane. The curved (r) part of the quartz glass was cut to a thickness of 3.0 mm, and the cross section morphology was observed under microscope to obtain FIG. 3.

Comparative Example 2

A process similar to that of Example 1 was carried out, except for treating the silica powder of Example 1 under hydrogen partial pressure of 0.1 MPa and at a heating temperature of 1000° C. for 10 hours. The hydrogen concentration of the silica powder thus obtained was found to be $5 \times 10^{16}$ molecules/cm$^3$. A 22-inch diameter quartz glass crucible was produced in the same manner as in Example 1 by using the hydrogen-doped silica powder above, and silicon single crystal was pulled up, but after passage of about 70 hours, pulling up was stopped because disordering occurred on the single crystal. After use, the transparent quartz glass layer of the quartz glass crucible was visually observed to find numerous pore expansion in the vicinity of the inner plane. The curved (r) part of the quartz glass was cut to a thickness of 3.0 mm, and the cross section morphology was observed under microscope to obtain FIG. 4.

Comparative Example 3

A 22-inch diameter quartz glass crucible was produced and silicon single crystal was pulled up therefrom in the same manner as in Example 1 except for using hydrogen-doped silica powder alone as in Example 3. After time passage of about 30 hours, pulling up was stopped because disordering occurred on the single crystal. After use, the transparent quartz glass layer of the quartz glass crucible was visually observed to find numerous pore expansions in the vicinity of the inner plane. The curved (r) part of the quartz glass was cut to a thickness of 3.0 mm, and the cross section morphology was observed under microscope to obtain FIG. 5.

ADVANTAGE OF THE INVENTION

By forming at least an inner surface layer of a quartz glass crucible for pulling up silicon single crystal using the hydrogen-doped silica powder according to the present invention, silicon single crystal can be pulled up in the quartz glass crucible without generating pore expansion on the inner surface of the crucible, and hence, without causing peeling off of quartz glass fractions. As a result, no transition occurs on silicon single crystal attributed to the peeling off of quartz grass fractions, and high quality silicon single crystals can be produced at high yield.

BRIEF DESCRIPTION OF THE DRAWINGS

FIG. 5 shows a cross sectional micrograph of a segment of a quartz glass crucible after pulling a silicon single crystal by use of a quartz glass crucible that is provided with an

DESCRIPTION OF THE REFERENCE NUMERALS AND SIGNS OF FIG. 1

Figure 1:
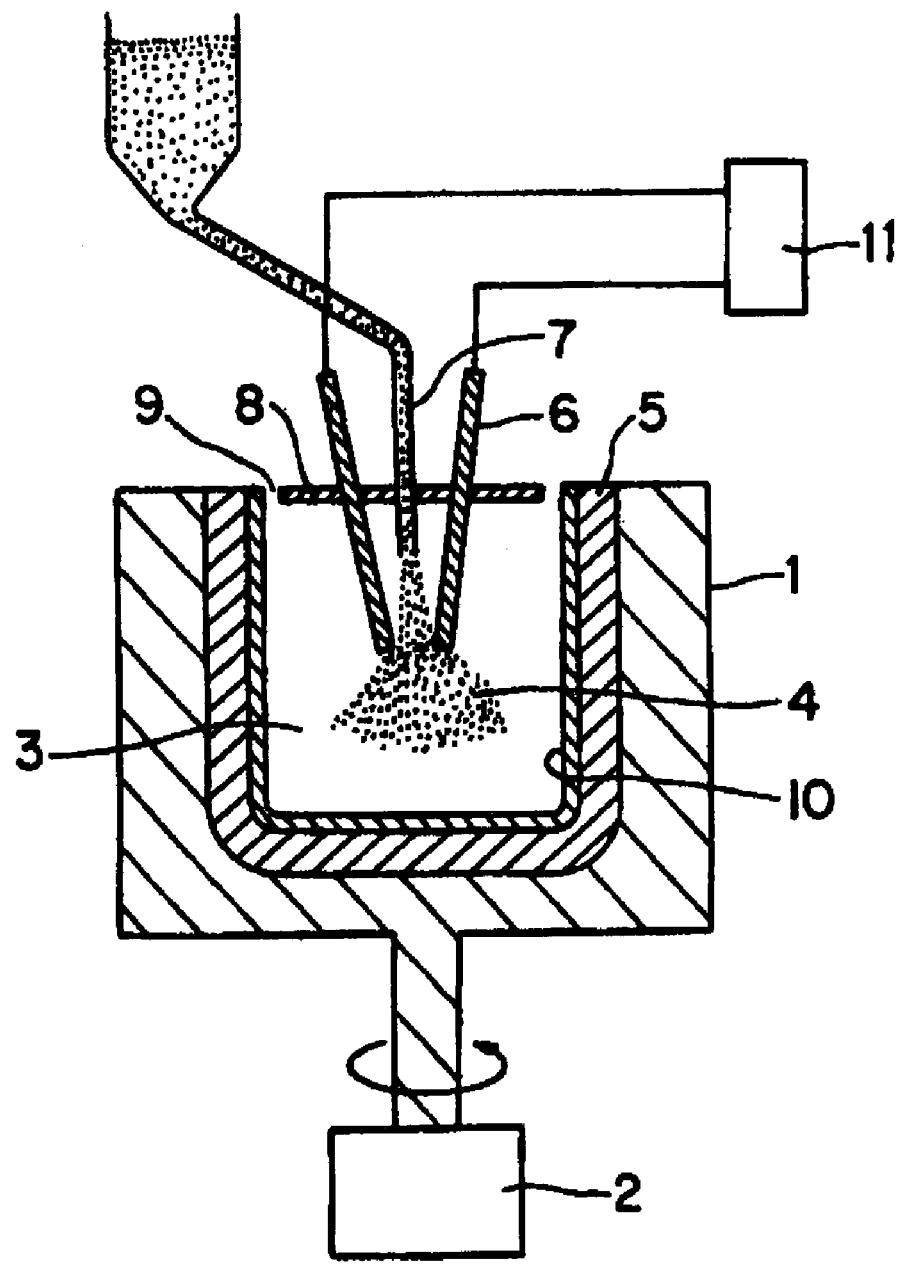
FIG. 1 is a schematic cross sectional view showing apparatus for producing a quartz glass crucible of the present invention.
Figure 2:
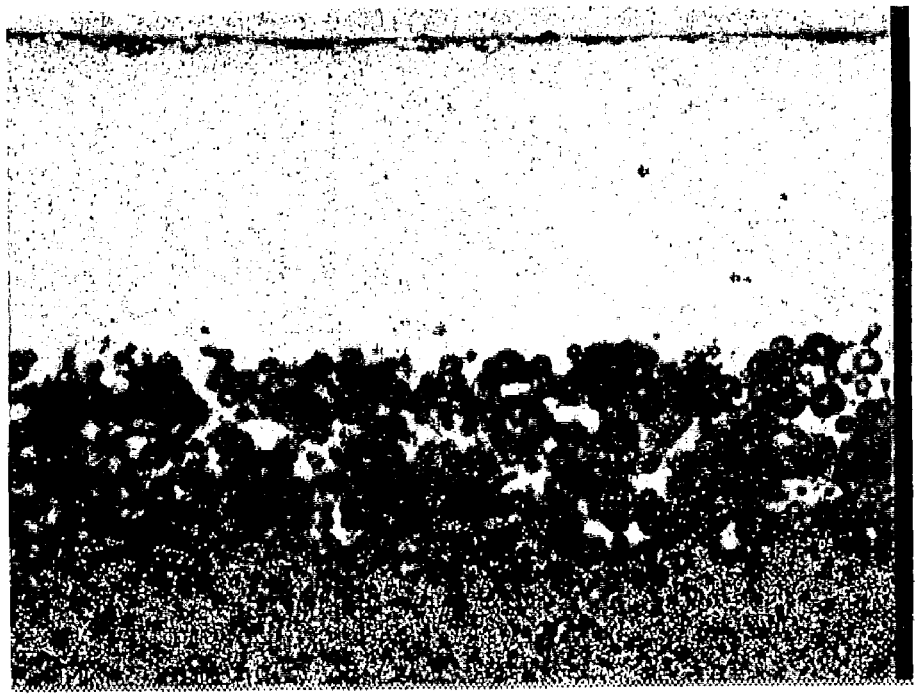
FIG. 2 shows a cross sectional micrograph of a segment of the quartz glass crucible after pulling silicon single crystal by use of the quartz glass crucible of the present invention.
Figure 3:
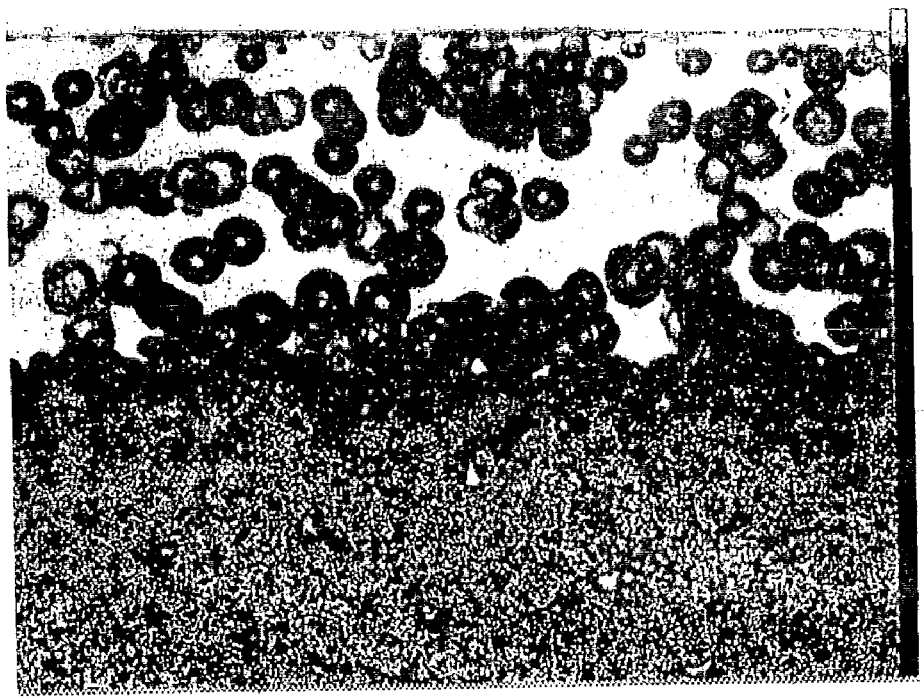
FIG. 3 shows a cross sectional micrograph of a segment of a quartz glass crucible after pulling a silicon single crystal by use of the quartz glass crucible that is provided with an internal surface layer made of silica powder that is not doped with hydrogen.
Figure 4:
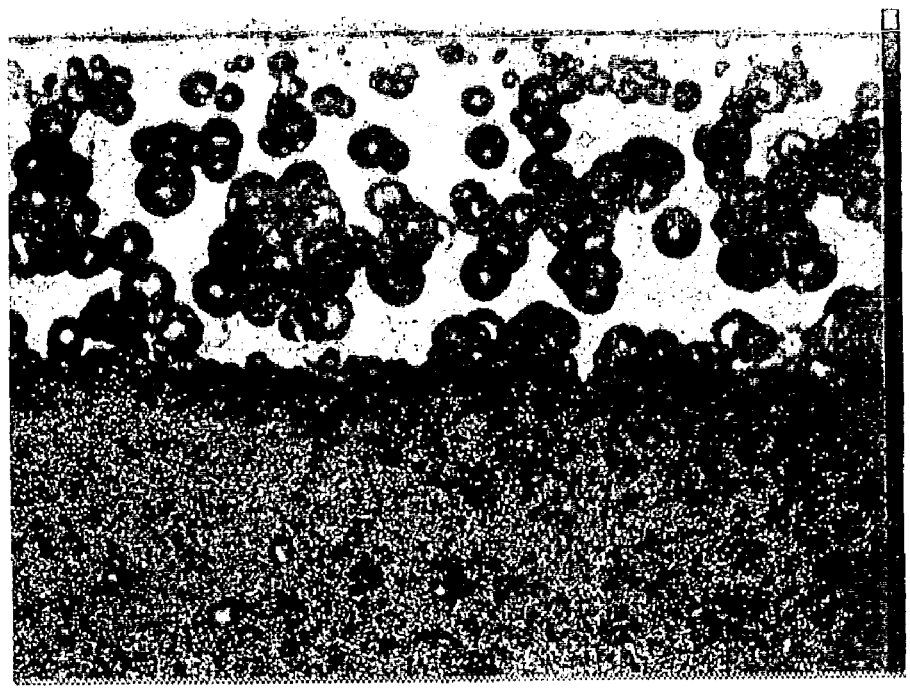
FIG. 4 shows a cross sectional micrograph of a segment of a quartz glass crucible after pulling a silicon single crystal by use of a quartz glass crucible that is provided with an internal surface layer made of silica powder that is processed for 10 hr under a hydrogen pressure of 0.1 MPa and a heating temperature of 1000 degree centigrade.
Figure 5:
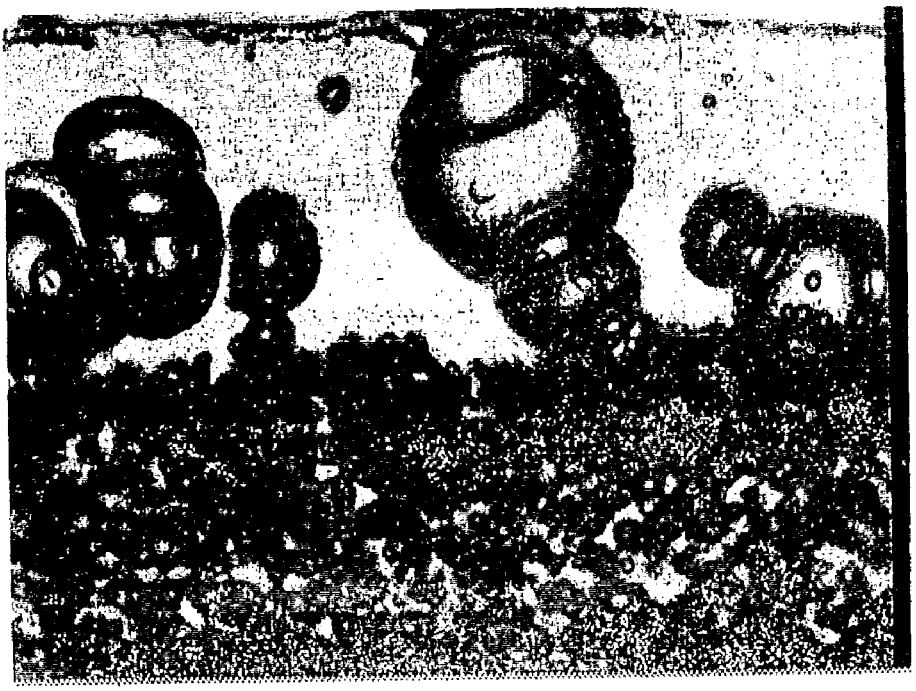

1 Rotation mold
2 Rotation mechanism
3 Cavity
4 Hydrogen-doped silica powder
5 Quartz glass crucible base substance
6 Arc electrode
7 Powder feeding means
8 Cap
9 Opening
10 Transparent quartz glass layer
11 Arc power supply

The invention claimed is:

1. A method for producing a quartz glass crucible, said method comprising:
   heating silica powder of high purity under a hydrogen pressure in a range of 0.05 to 10 MPa and a temperature in the range of 300 to 600 degrees centigrade so as to produce hydrogen-doped silica powder, the silica powder after the heating having an OH content that is not substantially greater than the OH content therein before said heating; and
   producing said quartz glass crucible at least in part from said hydrogen-doped silica powder.

2. The method according to claim 1 wherein the crucible is formed using a mixture of the hydrogen doped silica powder with non-doped silica powder.

3. The method according to claim 1 wherein the crucible is formed so as to have a quartz glass crucible body with a transparent quartz glass layer providing an inner surface thereof, said transparent quartz glass layer being formed of said hydrogen-doped silica powder.

4. The method of claim 3 wherein the quartz glass crucible body includes a base body supporting the transparent quartz glass layer, said base body being formed of non-doped silica powder.

5. A method for production of a quartz glass crucible for use in silicon single crystal pulling, comprising:
   heating silica powder of high purity under a hydrogen pressure in a range of 0.05 to 10 MPa and a temperature in the range of 300 to 600 degrees centigrade, wherein the silica powder is doped with hydrogen molecules in the range of $1\times10^{17}$ to $5\times10^{19}$ molecules/cm$^3$, the silica powder after the heating having an OH content that is not substantially greater than the OH content therein before said heating; and
   producing the quartz glass crucible from at least in part said hydrogen-doped silica powder.

6. The method according to claim 5 wherein the crucible is formed using a mixture of the hydrogen doped silica powder with non-doped silica powder.

7. The method according to claim 5 wherein the crucible is formed so as to have a quartz glass crucible body with a transparent quartz glass layer providing an inner surface thereof, said transparent quartz glass layer being formed of said hydrogen-doped silica powder.

8. The method of claim 7 wherein the quartz glass crucible body includes a base body supporting the transparent quartz glass layer, said base body being formed of non-doped silica powder.

* * * * *